(12) United States Patent
Bayless et al.

(10) Patent No.: US 11,784,050 B2
(45) Date of Patent: Oct. 10, 2023

(54) METHOD OF FABRICATING MICROELECTRONIC DEVICES AND RELATED MICROELECTRONIC DEVICES, TOOLS, AND APPARATUS

(71) Applicant: Micron Technology, Inc., Boise, ID (US)

(72) Inventors: Andrew M. Bayless, Boise, ID (US); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/241,386

(22) Filed: Apr. 27, 2021

(65) Prior Publication Data

US 2022/0344161 A1 Oct. 27, 2022

(51) Int. Cl.
*H01L 21/265* (2006.01)
*H01L 21/324* (2006.01)
*H01L 21/768* (2006.01)
*H01L 21/78* (2006.01)

(52) U.S. Cl.
CPC ...... *H01L 21/26506* (2013.01); *H01L 21/324* (2013.01); *H01L 21/76859* (2013.01); *H01L 21/78* (2013.01); *H01L 21/26513* (2013.01)

(58) Field of Classification Search
CPC ...................................................... H01L 21/78
See application file for complete search history.

(56) References Cited

U.S. PATENT DOCUMENTS

| | | | |
|---|---|---|---|
| 6,372,610 B1 | 4/2002 | Chang et al. | |
| 7,214,614 B2 | 5/2007 | Chopra | |
| 8,119,501 B2 | 2/2012 | Harris et al. | |
| 8,785,298 B2 | 7/2014 | Van Der Stam et al. | |
| 8,853,056 B2 | 10/2014 | Lei et al. | |
| 9,362,143 B2* | 6/2016 | Sun | H01L 21/563 |
| 9,934,998 B2 | 4/2018 | Han et al. | |
| 10,276,539 B1* | 4/2019 | Wirz | H01L 24/92 |
| 10,741,650 B2* | 8/2020 | Fujita | H01L 21/3247 |
| 10,886,255 B2* | 1/2021 | Hong | H01L 24/80 |
| 11,114,368 B2* | 9/2021 | Nomura | H01L 24/73 |
| 2014/0299887 A1* | 10/2014 | Matocha | H01L 23/3192 257/77 |
| 2018/0277640 A1* | 9/2018 | Fujita | H01L 21/3247 |
| 2020/0135698 A1* | 4/2020 | Hong | H01L 21/6836 |
| 2021/0234007 A1* | 7/2021 | Ueno | H01L 29/045 |
| 2022/0181299 A1* | 6/2022 | Kim | H01L 29/0684 |
| 2022/0344161 A1* | 10/2022 | Bayless | H01L 21/26506 |
| 2022/0392792 A1* | 12/2022 | Tseng | H01L 22/20 |

* cited by examiner

*Primary Examiner* — Bilkis Jahan
*Assistant Examiner* — Victor V Barzykin
(74) *Attorney, Agent, or Firm* — TraskBritt (57) ABSTRACT

A microelectronic device may have side surfaces each including a first portion and a second portion. The first portion may have a highly irregular surface topography extending from an adjacent surface of the microelectronic device. The second portion may have a less uneven surface extending from the first portion to an opposing surface of the microelectronic device. Methods of forming the microelectronic device may include creating dislocations in the wafer in a street between the one or more microelectronic devices by implanting ions and cleaving the wafer responsive to failure of stress concentrations near the dislocations through application of heat, tensile forces or a combination thereof. Related packages and methods are also disclosed.

28 Claims, 7 Drawing Sheets

METHOD OF FABRICATING MICROELECTRONIC DEVICES AND RELATED MICROELECTRONIC DEVICES, TOOLS, AND APPARATUS

TECHNICAL FIELD

Embodiments of the disclosure relate to a method of fabricating microelectronic devices. Specifically, embodiments relate to methods of separating wafers comprising arrays of microelectronic device locations into individual microelectronic devices, and to related microelectronic devices, tools, and apparatus.

BACKGROUND

As performance of electronic devices and systems increases, there is an associated demand for improved performance of the microelectronic components of such systems, while maintaining or even shrinking the form factor (i.e., length, width and height) of a microelectronic device or assembly. Such demands are often, but not exclusively, associated with mobile devices and high-performance devices. To maintain or reduce the footprint and height of an assembly of components in the form of microelectronic devices (e.g., semiconductor dice), three-dimensional (3D) assemblies of stacked components equipped with so-called through silicon vias (TSVs) for vertical electrical (i.e., signal, power, ground/bias) communication between components of the stack have become more common, in combination with the reduction in component thickness, as well as employment of preformed dielectric films in the bond lines (i.e., spaces between stacked components) to reduce bond line thickness while increasing bond line uniformity. Such dielectric films include, for example, so-called non-conductive films (NCFs), and wafer level underfills (WLUFs), such terms often being used interchangeably. While effective in reducing height of 3D microelectronic device assemblies, the reduction in thickness of microelectronic devices, for example semiconductor dice, to about 50 µm or less (e.g., 30 µm, 20 µm) increases device fragility and susceptibility to cracking under stress, particularly compressive (i.e., impact) stress and bending stress. Decreasing bond line thickness may also exacerbate susceptibility to damage to such extremely thin microelectronic devices, as the thin dielectric material (e.g., NCF) in the bond lines may no longer provide any cushioning effect or ability to accommodate particulate contaminants in the bond lines when, for example, a device is stacked on another device to form a 3D assembly. Non-limiting examples of microelectronic device assemblies including stacked microelectronic devices which may suffer from stress-induced cracking include assemblies of semiconductor memory dice, alone or in combination with other die functionality (e.g., logic) include so-called high bandwidth memory (HBMx), hybrid memory cubes (HMCs), and chip to wafer (C2 W) assemblies.

Furthermore, as the demand for microelectronic devices increases, the demand for lower cost microelectronic devices also increases, incentivizing the continued increase in circuit density and devices per wafer. The cost of producing microelectronic devices may be reduced by increasing efficiency of the processes, increasing the yield of microelectronic devices per wafer for each respective process, and reducing losses, such as due to circuit failures, physical die cracking, microcracking, and fractures, etc. Decreasing the cost of the microelectronic devices may, in turn, decrease the cost of the associated electronic assemblies and systems incorporating such microelectronic devices. In some cases decreasing the cost of the microelectronic devices may also enable increases in performance of the associated electronic devices without being cost prohibitive.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

The illustrations presented herein are not meant to be actual views of any particular microelectronic device, assembly, or component thereof, but are merely idealized representations employed to describe illustrative embodiments. The drawings are not necessarily to scale.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," etc., are generally used for clarity and convenience in understanding the disclosure and accompanying drawings and do not connote or depend on any specific preference, orientation, or order, except where the context clearly indicates otherwise.

As used herein, the term "and/or" means and includes any and all combinations of one or more of the associated listed items.

As used herein, the terms "vertical," "horizontal," and "lateral" refer to the orientations as depicted in the figures.

As the demand for microelectronic components increases, the demand for lower cost microelectronic components also increases. The cost of producing microelectronic devices may be reduced by increasing the yield of microelectronic devices for each act performed in the fabrication process.

Yield may be increased by reducing losses, such as failed devices, broken devices, etc. Another way that the yield may be increased is by reducing the area of a semiconductor wafer that is required between adjacent microelectronic device locations. For example, reducing a width of the so-called "street" or "scribe" area between adjacent, individual microelectronic device locations where the semiconductor wafer is singulated or diced to separate the semiconductor wafer into separate microelectronic devices may increase the area of the semiconductor wafer that is available for forming the microelectronic devices. Thus, decreasing the street width between the individual microelectronic devices may enable a larger number of microelectronic devices to be formed from each semiconductor wafer.

Figure 1:
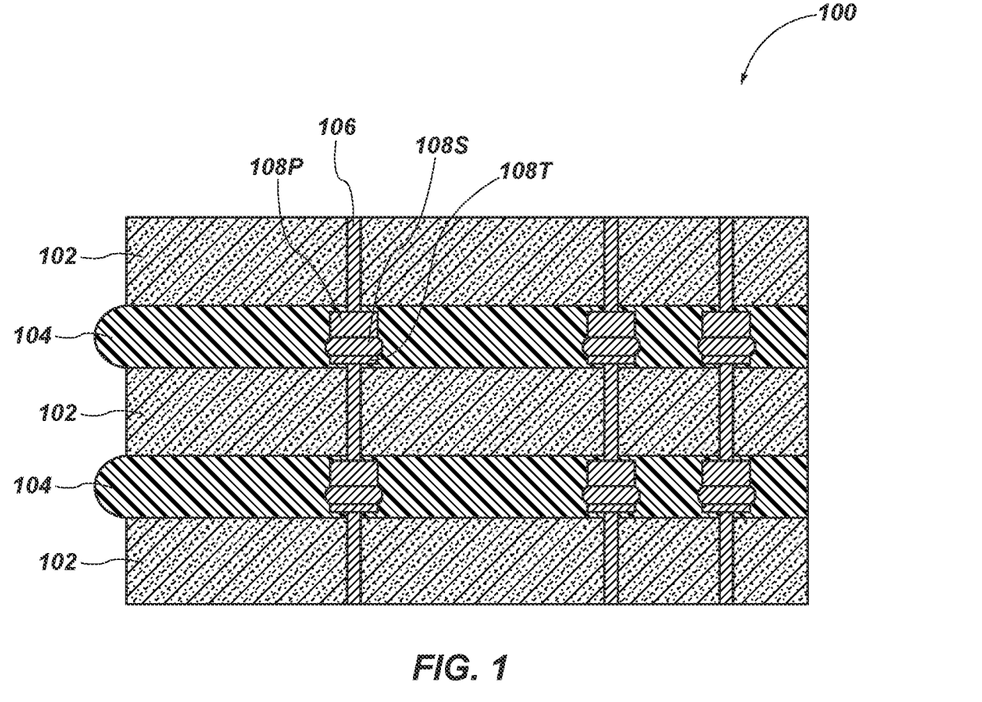
FIG. 1 illustrates a schematic view of a microelectronic device assembly comprising stacked semiconductor dice.

FIG. 1 illustrates a microelectronic device 100. The microelectronic device assembly 100 may include multiple semiconductor dice 102 arranged in a stack. A dielectric film 104, such as a non-conductive film (NCF) or a wafer level underfill (WLUF) may be positioned in a so-called bond line between each of the semiconductor dice 102. The microelectronic device 100 may include through silicon vias (TSVs) 106 aligned with contacts in the form of conductive pillars 108$p$ optionally capped with solder material 108$s$ and bonded to terminal pads 108$t$ of adjacent semiconductor dice 102 to provide electrical contacts between the semiconductor dice 102 and/or through the stack of dice. For example, the TSVs 106 and aligned contacts may provide power, ground/bias, and signal connections.

The height of the microelectronic device 100 may be reduced by reducing a thickness of the semiconductor dice 102 and/or the dielectric film 104. Reducing the thickness of the semiconductor die 102 may cause a semiconductor die 102 to be more fragile and susceptible to damage in the form of microcracking, cracking and edge chipping during the picking and stacking processes as described in further detail below. Reducing the thickness of the dielectric film 104 may reduce the ability of the dielectric film 104 to provide any cushioning effect between adjacent semiconductor dice 102 during stacking, as well as the ability to accommodate particulate contaminants generated during separation of the semiconductor dice 102 in bond lines thinner than the particle size without damage to the semiconductor dice 102. For example, contaminant particles between the semiconductor dice 102 may cause one or more of the semiconductor die 102 to crack or microcrack due to stress concentrations caused by the presence of contaminant particles larger than a thickness of dielectric film 104 when a semiconductor die 102 is picked from a carrier, transferred to a bond tip, or stacked on another semiconductor die 102 or a substrate. Further, in some instances, contaminant particles between the semiconductor die 102 may substantially prevent one or more of the conductive pillars 108$p$ from making electrical contact with an aligned terminal pad 108$t$, or compromise integrity of such contact.

Reducing and/or eliminating the introduction of contaminant particles to surfaces of the semiconductor dice during the singulation process may increase a yield of microelectronic devices by substantially reducing the losses from damage caused by such particles. Increasing the yield of microelectronic devices may decrease the costs associated with producing the microelectronic devices. These reduced costs may similarly reduce costs of associated electronic products incorporating the microelectronic devices, such as mobile phones, computers, laptops, etc.

Some embodiments of the present disclosure may include a method of fabricating a microelectronic device, including forming an array of microelectronic device locations on an active surface of a wafer. The method may further include securing the wafer to a carrier wafer. The method may also include thinning the wafer to about 30 microns (μm) or less. The method may further include implanting ions to initiate dislocations in semiconductor material of the wafer along streets between the microelectronic devices. The method may also include heating the wafer to form cracks along the streets from stress concentrations proximate the dislocations.

Figure 2:
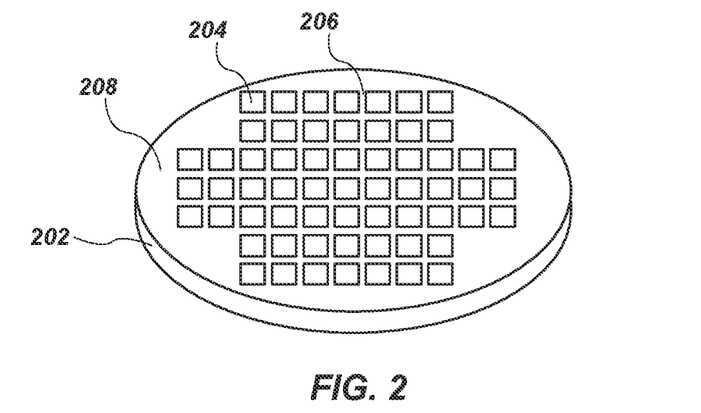
FIG. 2 illustrates a perspective view of a wafer with an array of microelectronic device locations formed thereon.

During the fabrication process, semiconductor dice may be formed in an array on a wafer. The locations of individual dice 204 may be formed on an active surface 208 of a wafer 202. The wafer 202 may be formed from a semiconductor material, such as silicon configured to provide a substrate for fabrication of integrated circuitry as well as structural support to the dice 204. The dice 204 may be formed by building up layers of insulating and conductive materials on the active surface 208 of the wafer 202 through processes, such as plating, sputtering, etc. The process of forming the dice 204 may also include material removal processes, such as wet etching, dry etching, photolithography, etc. The material removal and/or build up processes may utilize masks to control where material is removed and/or built up. The building up and removal processes may form features of the microelectronic devices, such as vias, through silicon vias (TSVs), wiring paths, under bump metallization (UBM), etc.

Each die 204 may be separated from adjacent dice 204 by streets 206. A width of the streets 206 may define distances between the dice 204. When using conventional singulation processes, reductions in width of the streets 206 may be constrained by the width required by the tool (e.g., wafer saw, laser beam, etc.) used to singulate (e.g., dice, cut, separate) the wafer 202 into individual dice 204. Conventional blade dicing operations may require the width of the streets 206 to be between about 20 micrometers (μm) and about 80 or even more, depending on blade width. Thus, a significant portion of the surface of the wafer 202 must be dedicated to the area of the streets 206 between the dice 204. Reducing the width of the streets 206 may enable a larger number of dice 204 to be formed on each wafer 202, which may increase the yield for each wafer 202.

Figure 3:
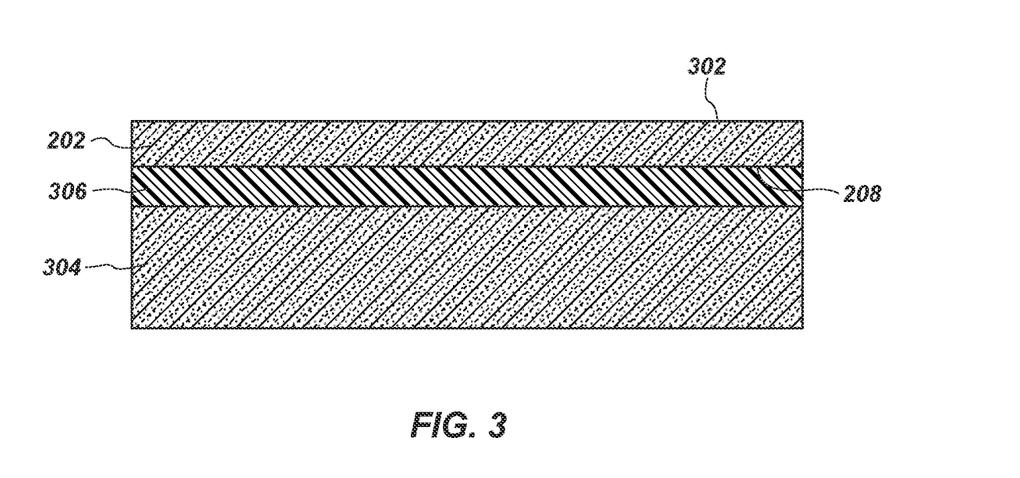
FIGS. 3-8 illustrate cross-sectional views of process acts of forming microelectronic devices in accordance with an embodiment of the present disclosure.

After the dice 204 are formed on the active surface 208 of the wafer 202, the wafer 202 may be coupled to a carrier wafer 304 through an adhesive 306, as illustrated in FIG. 3. The adhesive 306 may couple the active surface 208 of the wafer 202 to the carrier wafer 304, such that a rear surface 302 of the wafer 202 remains exposed. The adhesive 306, may be an adhesive material configured to secure the wafer 202 at elevated temperatures above ambient (e.g., about 25° C.) such as temperatures between about 150° C. and about 250° C., such as between about 170° C. and about 220° C., or between about 180° C. and about 200° C. Some examples of adhesives that are formulated to secure a wafer at elevated temperatures may include BREWERBOND® materials sold by BREWER SCIENCE® of Missouri, the TA series of adhesives sold by SHIN-ETSU® of Taiwan, or the XP series of adhesives sold by DOW CHEMICAL® of Michigan. The carrier wafer 304 may be configured to support the wafer 202 through additional prior processing acts, such as wafer thinning. For example, very thin wafers 202 may require exceptionally rigid support to substantially prevent cracking, warping, and other potential damage to the wafer 202 during processing acts that may include temperature changes, mechanical material removal, chemical material removal, etc.

Figure 4:
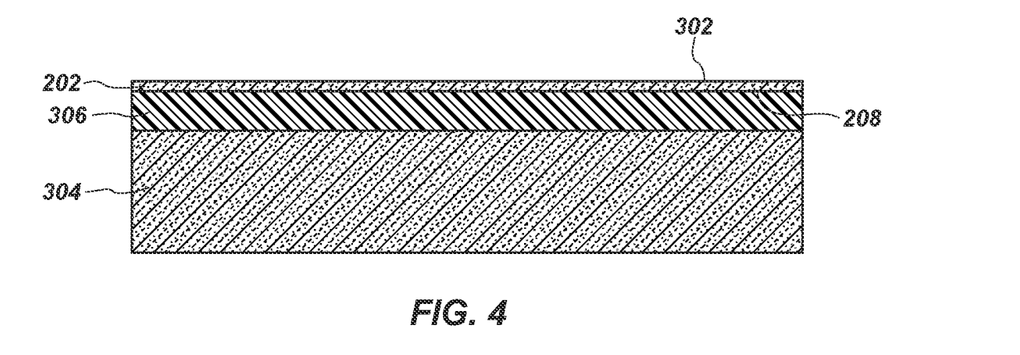

Once the wafer 202 is adhered to the carrier wafer 304, the wafer 202 may be thinned as illustrated in FIG. 4. The wafer 202 may be thinned from an initial thickness, for example between about 775 µm and about 600 µm through material removal processes, such as back grinding, polishing processes and wet etching. The material removal processes may remove material from the exposed rear surface 302 of the wafer 202. In some embodiments, a latter portion of the material removal process (i.e., wet etching) may be used to remove sufficient semiconductor material to expose features, such as TSVs through the rear surface 302 of the wafer 202 to form electrical connections between the rear surface 302 and integrated circuitry of the active surface 208 of the wafer 202.

Figure 5:
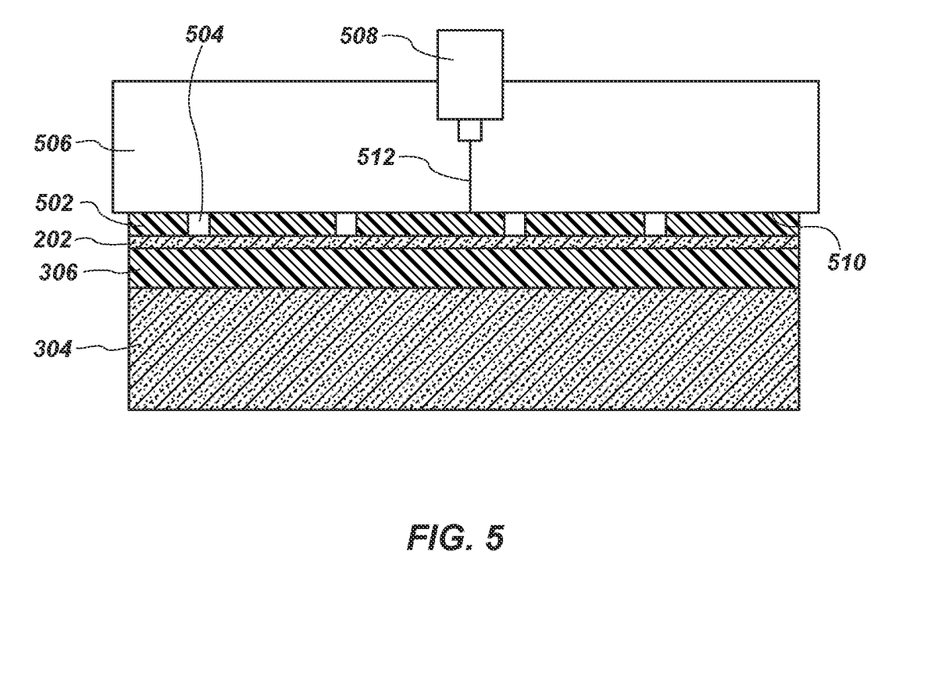

The material removal process may thin the wafer 202 to a thickness of less than about 50 such as less than about 30 less than about 20 or less than about 10 Reducing the thickness of the wafer 202 may in turn reduce the thickness of the resulting microelectronic devices. For example, the resulting microelectronic devices may have a thickness of between about 30 µm and about 8 µm, such as between about 20 µm and about 7 to 10 In the latter case, the microelectronic devices may include integrated circuitry to a depth of about 5 to 8 µm, and a thickness of supporting semiconductor material of about 2 µm. While the wafer 202 is being processed, one or more implantation (i.e., dopant) species may be implanted into the streets 206 between the dice 204 in an implant process, as illustrated in FIG. 5. FIG. 5 illustrates the implant process occurring on the rear surface 302 of the wafer 202 after the thinning process illustrated in FIG. 4; however, it is noted that the implantation process may be performed at earlier stages and/or on the active surface 208 of the wafer 202 as will be described in detail herein below.

During implantation, ions of an implantation species, such as hydrogen, helium, arsenic, boron, phosphorus, etc., may be accelerated toward a surface of the wafer 202. An implant tool 506 may include a beam generator 508 configured to accelerate the ions and form an energy beam 512 of ions to impinge on the surface of the wafer 202. The beam generator 508 may receive ions of the respective species from an ion source. The ions may then be accelerated to a high energy through an electrostatic accelerator, such as a magnet or field of magnets. After being accelerated, the ions may have an energy of at least about 10 kiloelectronvolts (keV), such as at least about 100 keV, or at least about 250 keV. The implant tool 506 of the present disclosure may be configured to implant ions into the wafer 202 without the aid of an increased temperature, commonly referred to in the art as a temperature drive. Not increasing the temperature above ambient (e.g., about 25° C.) may allow the implant process to be performed after the dice 204 have been formed without compromising the thermal budget of the dice 204 and causing damage to the integrated circuitry and associated features of the dice 204. Furthermore, not increasing the temperature may allow the implant process to be performed on the wafer 202 after the thinning process without risk of warping or otherwise damaging the wafer under excessive heat.

The energy imparted to the ions during implantation may affect the depth into the wafer 202 that the ions will penetrate. For example, ions having higher energy may penetrate the wafer 202 to a greater depth than ions of the same species having a lower energy. The ion species may also effect the penetration depth of the ions. For example, ions of a small molecular species, such as hydrogen or helium, may have a greater penetration depth than ions of a larger molecular species, such as boron, phosphorus, or arsenic. In some embodiments, multiple different implant species may be used on the same wafer 202, such that multiple different depths of penetration may be achieved in the same regions of the wafer 202. Penetration of the ions of the implantation species into the semiconductor material of the wafer 202 may cause damage to the wafer 202, such as point defects, dislocations, etc., at the penetration depth and/or along the path to the penetration depth. During the implant process the ions may penetrate to depths of at least about 2 µm, such as at least about 3 µm, at least about 4 µm. The smaller species of ions may penetrate to greater depths, such as at least about 4 µm and may cause smaller amounts of damage during the penetrations. On the other hand, while the larger species of ions may not penetrate the wafer to as great of a depth as the smaller species, the larger species of ions may generate larger amounts of damage at the lesser depth than the smaller species. In one implementation, hydrogen or helium ions may first be implanted to an ultimate implantation depth, after which boron, phosphorous or arsenic ions may be implanted above and to a lesser depth than the hydrogen or helium molecules.

A mask 502 may be positioned between the implant tool 506 and the wafer 202. The mask 502 may be configured to control and limit the portions of the wafer 202 on which the ions impinge. For example, the mask 502 may include a pattern of openings 504. The openings 504 may be arranged such that the ions only impinge on the portions of the surface of the wafer 202 that coincide with the streets 206 between the dice 204.

In some embodiments, the mask 502 may be positioned over the wafer 202, such as through a mask aligner or stepper, etc. For example, the mask 502 may be aligned with the rear surface 302 of the wafer 202, as illustrated in FIG. 5, such that the openings 504 in the mask 502 are substantially aligned with the streets 206 on the active surface 208 of the wafer 202. In some embodiments, the mask 502 may be formed on the active surface 208 of the wafer 202 during the die fabrication process discussed with respect to FIG. 2. For example, the mask 502 may be positioned or formed on the active surface 208 of the wafer 202 and the ions may be implanted into the streets 206 between the die 204 by the implant tool 506 after the dice 204 are formed and before the active surface 208 of the wafer 202 is coupled to the carrier wafer 304. In some embodiments, the mask 502 may be one of the masks used in a material adding or material removal process as discussed above with respect to FIG. 2. The implant tool 506 may then implant the ions into the active surface 208 of the wafer 202 during, directly before or after one of the material build up or material removal processes.

In some embodiments, a material removal process, such as dry etching may be used to remove material in the streets 206 and form trenches or channels in the area of streets 206 before the implant process. Removing material in the street 206 before the implant process may enable the implanted ions to penetrate a greater distance into the wafer 202 from the active surface 208 before the material removal process. In some embodiments, the material removal process and the implant process may utilize the same mask 502.

In some embodiments, the mask 502 may be coupled to the implant tool 506. For example, the mask 502 may be a reusable mask 502 configured for a specific die type (i.e., length and width) coupled to a face 510 of the implant tool 506, or may be mounted internally within the tool chamber. The implant tool 506 may then be substantially aligned with the wafer 202, such that the openings 504 in the mask 502 are substantially aligned with the streets 206. The implant tool 506 may then implant ions into the active surface 208 and/or the rear surface 302 of the wafer 202 through the openings 504 in the mask 502.

The openings 504 in the mask 502 may have a width corresponding to a width of desired separation along streets between locations of dice 204 of less than about 10 µm, such as between about 1 µm and about 10 µm, or between about 1 µm and about 5 µm, or between about 1 µm and about 2 µm.

Figure 6:
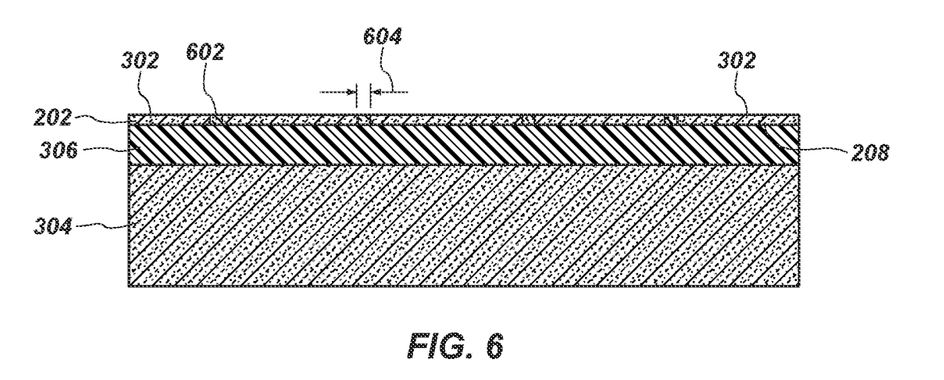

FIG. 6 illustrates the wafer 202 after the thinning process of FIG. 4 and the implant process of FIG. 5. After the implant process the wafer 202 may include an implanted region 602. The implanted region 602 may include molecules of the implant species as well as dislocations and point defects associated with the implant process. As a result of implanting the wafer 202 through the mask 502, the implanted region 602 may substantially coincide with the openings 504 in the mask 502. Therefore, the implanted region 602 may substantially coincide with the streets 206 between the dice 204. The implanted region 602 may include a concentration of implant species of between about 1e12 atoms/cm$^3$ and about 10e16 atoms/cm$^3$, such as between about 1e12 atoms/cm$^3$ and about 5e16 atoms/cm$^3$.

Larger concentrations of the implanted ion species may result in greater amounts of damage to the wafer 202 in the implanted regions 602. As the implanted regions 602 may coincide with the streets 206 between the dice 204, the damage to the wafer 202 may be substantially concentrated within the streets 206. As noted above, openings 504 in the mask 502 may be sized, such that the implanted regions 602 may have a width 604 of less than about 10 µm, such as between about 1 µm and about 5 µm, or between about 1 µm and about 2 µm.

The implanted regions 602 may have a greater amount of damage and residual implanted ions proximate the active surface 208, or rear surface 302 of the wafer 202 into which the ions were implanted by the implant tool 506. The damage and/or residual implanted ions may gradually reduce as the depth into the wafer 202 increases.

Figure 7:
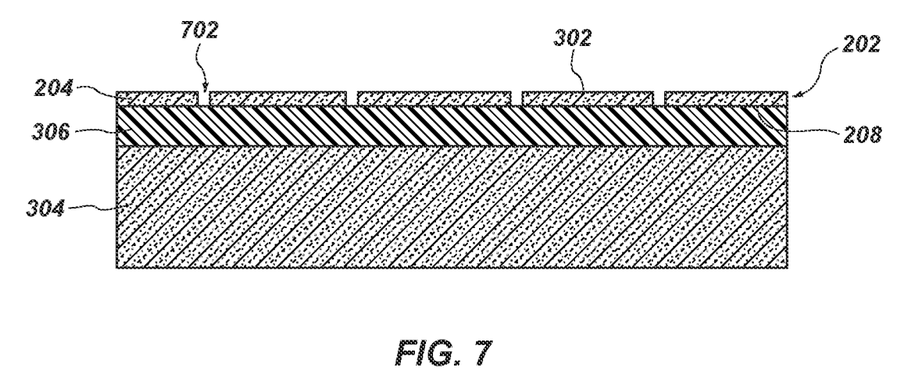

In some embodiments, as illustrated in FIG. 7, the wafer 202 may be heated while coupled to the carrier wafer 304. Heating the wafer 202 may cause the wafer 202 to fracture in the implanted regions 602. For example, the damage caused by the implanted ions in the implanted regions 602 may create stress concentrations within the wafer 202. As the wafer 202 is heated the stress concentrations in the implanted regions 602 may cause cracks 702 to propagate through the thickness of the wafer 202 in an area substantially aligned with the implanted regions 602 and cleave the semiconductor material along the area of streets 206. The cracks 702 may substantially separate (e.g., singulate) the wafer 202 into individual dice 204. Heating the wafer 202 above ambient (e.g., about 25° C.) may cause the temperature of the wafer 202 to rise between about 150° C. and about 250° C., such as between about 170° C. and about 220° C., or between about 180° C. and about 200° C. At higher concentrations of ions as well as damage in the implanted regions 602, relatively lower temperature changes may generate the cracks 702 and singulate the wafer 202. Similarly, deeper penetration may enable the cracks 702 to be generated at lower temperatures. Thus, implanting ions of a smaller species, such as hydrogen or helium, may enable the cracks 702 to propagate at lower temperatures, which may reduce the time and energy required to singulate the wafer 202 and may reduce the risks of temperature damage to the wafer 202 and associated dice 204. It may also be desirable to implant smaller species of ions, for example, hydrogen or helium, in implementation of this embodiment in light of an obtainable deeper penetration depth at a reasonable energy level in comparison to larger species. In addition, singulating at lower temperatures significantly reduces the impact on the thermal budget of semiconductor dice, lessening any potential for degradation of the integrated circuitry.

The wafer 202 may be heated using heating tools, such as hot plates, hot chucks, lasers, resistance heaters, etc. For example, the carrier wafer 304 and the wafer 202 may be placed on a hot plate or hot chuck. In some cases, a hot plate or hot chuck may contact the rear surface 302 of the wafer 202. In other embodiments, the beam of a laser may impinge on a surface 208, 302 of the wafer 202 or a resistance heater may be placed over wafer 202 in close proximity to cause the temperature of the wafer 202 to increase. Heating wafer 202 from above may result in a smaller temperature gradient between the heat source and the implant area.

During the heating process the carrier wafer 304 and adhesive 306 may, in combination support the wafer 202 against any displacement. For example, the carrier wafer 304 may enable the wafer 202 to absorb the heat after thinning without any substantial heat damage, such as warping, or shifting of position of the semiconductor dice 204 singulated from the wafer. Further, singulation on the carrier wafer 304 and picking the semiconductor dice 204 from the carrier wafer after release of the adhesive 306 eliminates potential damage to wafer 202 and semiconductor dice 204 resulting from transfer to an expandable carrier material (e.g., dicing tape, mount tape or film) for a subsequent pick and place operation of the semiconductor dice 204 with a pick tool, as well as potential damage from debond of semiconductor dice 204 from adhesive securing the dice to the carrier material. The adhesive 306 may be formulated to release when exposed to light, such as in the infrared (IR) range or the ultraviolet (UV) range. Light in the IR or UV range may penetrate through the carrier wafer 304 causing the adhesive 306 to release.

In some embodiments, the semiconductor dice 204 may be picked from the surface of the carrier wafer 304 with a die stacking tool, such as a bond head, configured to lift a semiconductor die 204 from the rear surface 302. The die stacking tool may be configured to clean the active surface 208 of the semiconductor die 204, to clear any residual adhesive and/or particles from the active surface 208. For example, the die stacking tool may include a nozzle for cleaning the active surface 208 of the semiconductor die 204. In some embodiments, the semiconductor die 204 may be transferred to a cleaning tool, such as a cleaning platform configured to clean the residual adhesive from the active surface 208. The die stacking tool may then be configured to couple the semiconductor die 204 to other semiconductor dice forming a die stack, as discussed in further detail below.

Some embodiments of the present disclosure may include a method of separating microelectronic devices (e.g., semiconductor dice) from a wafer. The method may include employing an ion implantation process to provoke dislocations in a semiconductor wafer in streets between the microelectronic devices. The method may further include transferring the semiconductor wafer to a laterally expandable carrier material and adhering the semiconductor wafer to a surface of the carrier material. The method may also include applying a tensile force on the wafer by expansion of the carrier material to form cracks in the streets between the microelectronic devices and separate the microelectronic devices.

Figure 8:
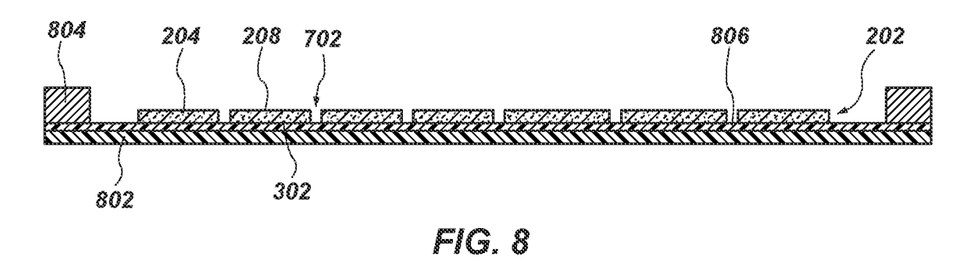

In some embodiments, as illustrated in FIG. 8, the wafer 202 may be inverted on the carrier wafer 304 and transferred to a carrier material 802, such as dicing tape or mount tape or film. To transfer the wafer 202 from the carrier wafer 304 to the carrier material 802, the adhesive 306 may be released to release the wafer 202 from the carrier wafer 304. For example, the adhesive 306 may be released through a light or laser impinging on the wafer 202 or carrier wafer 304. In other embodiments, the adhesive 306 may be released through other known methods, such as chemical releases and/or mechanical releases. The carrier material 802 may be secured to and supported by a film frame 804. The carrier material 802 may include an adhesive 806 formulated to secure the wafer 202 to the carrier material 802. The rear surface 302 of the wafer 202 may be adhered to the carrier material 802, such that the active surface 208 of the wafer 202 faces upwardly and away from the carrier material 802.

The carrier material 802 may be a flexible material, expandable in the X-Y plane (i.e., laterally). After the wafer 202 is secured to the carrier material 802, the carrier material 802 may be stretched by the film frame 804. Stretching the carrier material 802 may apply tensile forces on the wafer 202. The stress concentrations around the damage in the implanted regions 602 may cause the wafer 202 to fracture and cleave along the implanted regions 602 of streets 206, creating cracks 702 through the wafer 202 that substantially coincide with the implanted regions 602 and/or the streets 206. The cracks 702 may substantially separate the wafer 202 into individual semiconductor dice 204.

Larger amounts of damage in the implanted regions 602 may enable the cracks 702 to be formed with less tensile force. Thus, implanting the implanted regions 602 with ions from larger species may enable the cracks 702 to form under less tensile force. Reducing the tensile force may enable lighter materials to be used for the carrier material 802 and may reduce the amount thickness and strength of the adhesive required on the carrier material 802. More options of carrier material 802 and adhesives may reduce the manufacturing costs, as carrier material 802 will not have to support stresses incurred by conventional blade dicing or heat from laser or stealth dicing. Further, carrier material 802 may provide advantages in chemical resistance, use at lower temperatures and thinner adhesives to provide better fixed positioning of the semiconductor dice 204. Suitable carrier materials include KAPTON® polyimide film from DuPont Corporation, as well as various adhesive films available from NITTO Americas and LINTEC Corporation.

In some embodiments, the wafer 202 may be separated through both a heating process as illustrated in FIG. 7 and the stretching process illustrated in FIG. 8. For example, the wafer 202 may be heated on the carrier wafer 304 as illustrated in FIG. 7, causing fractures and cracks 702 to propagate through the wafer 202. After the cracks 702 are formed in the heating process, the wafer 202 may be transferred to the carrier material 802 and stretched. Stretching the wafer 202 may complete any incomplete fractures or cracks 702, such as in areas where the concentration of damage and ions was insufficient to fracture completely through the thickness of the wafer 202 at the temperature used in the heating process. In some embodiments, a significantly lower temperature may be used on carrier wafer 304 to reduce a risk of temperature damage to the wafer 202, such that the heating process may expand the damage and form some cracks 702, which the stretching process of FIG. 8 may complete any incomplete cracks 702.

In some embodiments, the wafer 202 may be heated after being transferred to the expandable carrier material 802. For example, some types of carrier materials 802 may be selected to withstand relatively high temperatures, such that the wafer 202 may be heated while secured to the expandable carrier material 802. In some cases, the wafer 202 may then be stretched on the expandable carrier material 802 to complete any unfinished cracks 702 before picking the dice 204 from the surface of the carrier material 802. In other cases, the dice 204 may be picked from the surface of the carrier material 802 without further stretching the wafer 202.

In some embodiments, the wafer 202 may be completely singulated through only one of the above processes. For example, the cracks 702 may be formed through the heating process of FIG. 7 and upon completing the heating process the individual dice 204 may then be picked from the surface of the carrier wafer 304 or expandable carrier material 802 for further processing, such as stacking. In some embodiments, the wafer 202 may be transferred to the carrier material 802 without having undergone any heating and the wafer 202 may then be stretched as described above to singulate the wafer 202 into individual dice 204, which may then be picked from the carrier material 802 to undergo further processing.

In implementing methods of the embodiments, successful cleaving of wafer 202 on carrier wafer 304 due to heating may be confirmed by optical inspection from above. If wafer 202 is cleaved on expandable carrier material 802, carrier material may be illuminated from below and any uncleaved street areas detected optically as opaque or partially occluded.

Figure 9:
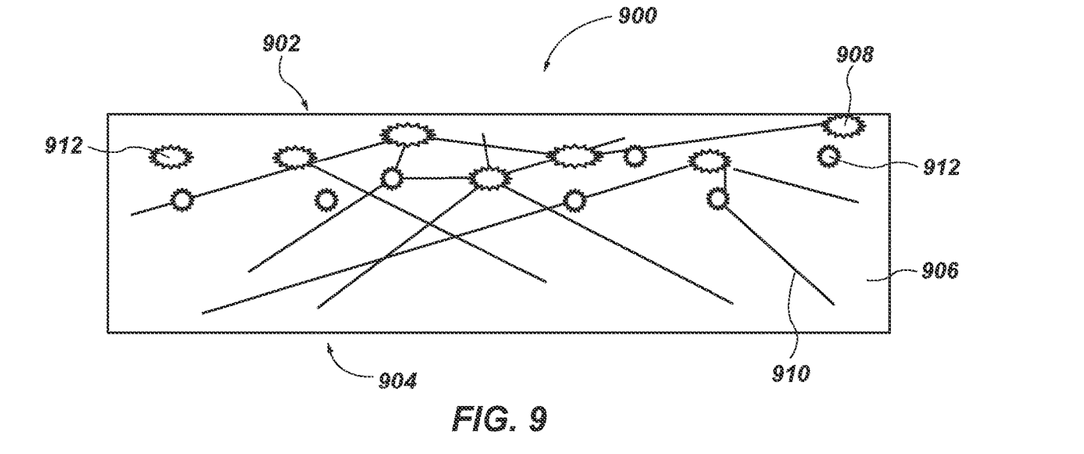
FIG. 9 illustrates a plan view of a side surface of a microelectronic device in accordance with an embodiment of the present disclosure.

Some embodiments of the present disclosure may include a microelectronic device 900 (e.g., semiconductor die). The microelectronic device 900 may include an active surface and a rear surface opposite the active surface. The microelectronic device may further include side surfaces of the semiconductor material extending between the active surface and the rear surface. The side surface may include a first portion having highly irregular (i.e., jagged) surface topography. The highly irregular surface topography may extend to a distance of between about 2 μm and about 6 μm from at least one of the active surface 208 and the rear surface 302 of the microelectronic device, depending upon the embodiment employed to singulate the microelectronic device 900 from a wafer 202. The side surface may further include a second portion extending from the first portion to another of the active surface and the rear surface having a less uneven surface.

FIG. 9 illustrates a plan view of a side surface 906 of a microelectronic device 900 singulated by the method described above. The side surface 906 of the microelectronic device 900 may exhibit damage 908 from the implanted ions. As described above, the damage 908 may include dislocations and point defects resulting from the impact of the individual ions in the implant process. The damage 908 may show as peaks and valleys in the side of the microelectronic device 900 extending from the ion-implanted surface of the die 900 at least to an area of maximum species penetration. The side surface 906 may also include fracture lines 910 extending from the jagged or broken edges of the damage 908. The fracture lines 910 may be the result of the cracks 702 described above that are formed by heating and/or stretching the wafer 202.

The side surface 906 of the microelectronic device 900 may also include residual ions 912 embedded within the side surface 906, such that the residual ions 912 may be detected, such as through secondary ion mass spectrometry (SIMS) or energy-dispersive X-ray spectroscopy (ERX) from the side surface 906 and may not be on the outer portion of the side surface 906 connected to the fracture lines 910. Some of the portions of damage 908 and/or residual ions 912 may be larger than others. For example, as described above, some of the ion species may be larger, such as boron, phosphorus, arsenic and some may be smaller, such as hydrogen. In some embodiments, the implant process may use multiple different ion species to achieve damage at different depths. The larger damage 908 and/or residual ions 912 may be closer to a first surface 902 than the smaller damage 908 and/or residual ions 912. The first surface 902 may be the surface into which the ions were implanted that is adjacent and transverse to the side surface 906.

In some embodiments, only one species may be used. Some of ions may travel a greater distance into the wafer while others may experience more early collisions and may stop closer to the first surface 902. The ions that travel farther into the wafer may experience collisions as they pass through the areas of the wafer closer to the first surface 902. Therefore, the larger amounts of damage 908 and/or number of residual ions 912 may remain closer to the first surface 902, with the amount of damage and/or number of residual ion 912 gradually reducing as the distance from the first surface 902 increases. Such an approach may result in a wedge effect, enhancing the potential for cleaving at lower temperatures, lower tensile stresses, or both.

The damage 908 and/or residual ions 912 may extend to a distance from the first surface 902 of between about 1 µm and about 6 µm, such as between about 2 µm and about 5 µm, or between about 2 µm and about 4 µm.

As described above, the ions may be implanted into the active surface 208 or the rear surface 302 of the wafer 202. Therefore, in some embodiments, the first surface 902 may coincide with the active surface 208 of the wafer 202 and associated semiconductor dice 900. In other embodiments, the first surface 902 may coincide with the rear surface 302 of the wafer 202 and associated semiconductor dice 900. A second surface 904 on an opposite side of the microelectronic device 900 may be the opposing active surface 208 or rear surface 302 from the first surface 902 of the wafer 202 and associated semiconductor die 900. The distance between the first surface 902 and the second surface 904 may be substantially the same as the final thickness of the associated wafer 202 after the thinning process illustrated in FIG. 4. Therefore, the distance between the first surface 902 and the second surface 904 may be less than about 30 µm, such as less than about 20 µm, or less than about 10 µm.

Figure 10:
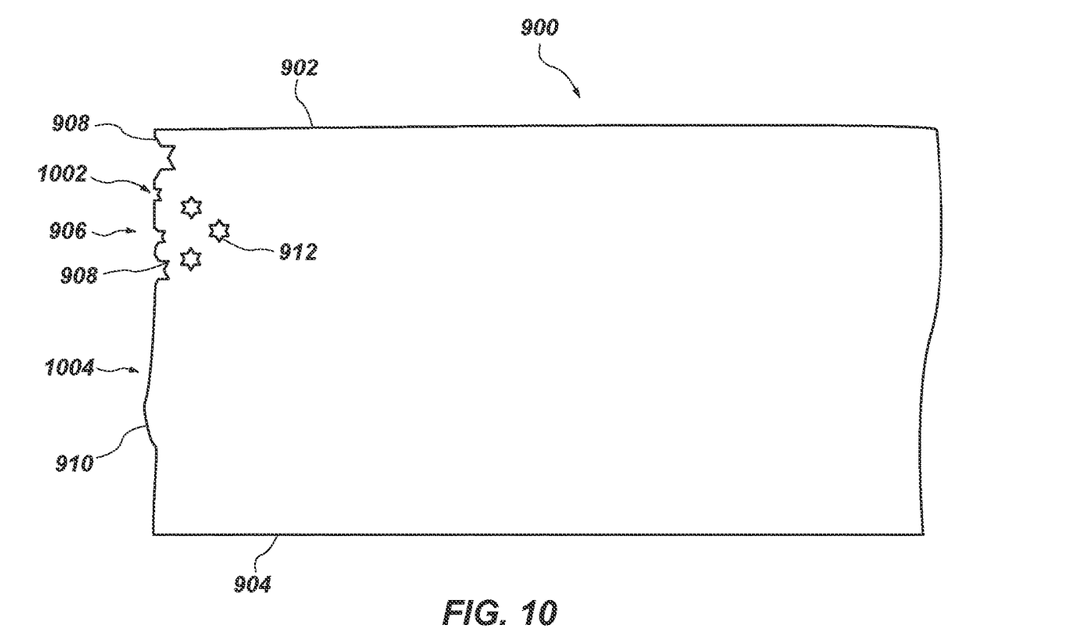
FIG. 10 illustrates a profile view of a side surface of a microelectronic device in accordance with an embodiment of the present disclosure.

FIG. 10 illustrates a profile view of a side surface 906 of the semiconductor die 900. The portion of the side surface 906 where the damage 908 is present may exhibit a highly irregular topography 1002 characterized by sharp edges, protrusions, and recesses surrounding the points of damage 908 where the ions collided with the materials of the wafer as they were implanted into the first surface 902 of the wafer 202. Thus, the highly irregular topography 1002 may begin proximate the first surface 902 of the microelectronic device 900 extending toward the second surface 904. The highly irregular topography 1002 may extend a distance from the first surface 902 of between about 1 µm and about 6 µm, such as between about 2 µm and about 5 µm, or between about 2 µm and about 4 µm.

The remainder of the side surface 906 may be a somewhat irregular, but less uneven surface 1004, characterized by flat surfaces interrupted by fracture lines 910. The uneven surface 1004 may extend from the highly irregular topography 1002 to the second surface 904.

As described above, residual ions 912 may also be imbedded in the microelectronic device 900 to a depth beneath the side surface 906 of the microelectronic device 900. The residual ion 912 may be located in the microelectronic device 900 in substantially the same regions as the highly irregular topography 1002 and laterally adjacent the highly irregular topography 1002.

Figure 11:
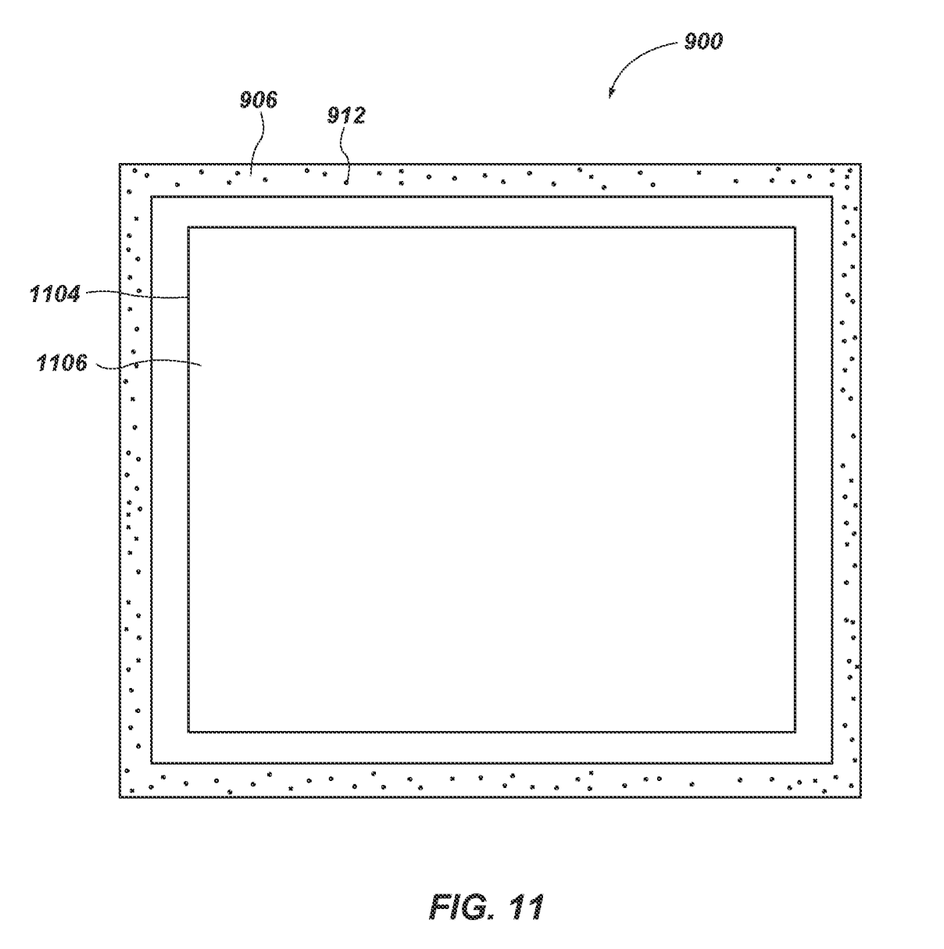
FIG. 11 illustrates a top view of a microelectronic device in accordance with an embodiment of the present disclosure.

FIG. 11 illustrates a top view of the microelectronic device 900. The microelectronic device 900 may include an active region 1106 where integrated circuitry and associated features of the microelectronic device 900 may be formed. The active region 1106 of the microelectronic device 900 may be substantially surrounded by a barrier 1104 extending downwardly from the surface including active region 1106 into the semiconductor material of the microelectronic device 900 and configured to separate the active region 1106 from side surfaces 906, which may form the outer perimeter of the microelectronic device 900. The barrier 1104 may be formed from a material selected to substantially prevent diffusion of other materials, such as the ions from the implant process, into peripheral areas of the active region 1106 bearing integrated circuitry. The barrier 1104 may be formed from a material such as tungsten, titanium, cobalt, ruthenium, tantalum, tantalum nitride, indium oxide, tungsten nitride, titanium nitride, etc. In some embodiments, the barrier 1104 may also be configured to mechanically protect the active region 1106, such that when the wafer is singulated any resulting cracks in the side surfaces 906 do not propagate into the active region 1106.

The side surfaces 906 may include residual ions 912 embedded from the implant process. The active region 1106 may be substantially free of residual ions 912. As described above, the implant process may include a mask 502 configured to substantially control the locations where the implanted ions are directed to coincide with the streets 206. Furthermore, as noted above, the barrier 1104 may be configured to substantially block any errant ions from entering the active region 1106 from semiconductor material adjacent to side surfaces 906.

Some embodiments of the present disclosure may include a microelectronic package. The microelectronic package may include one or more microelectronic devices. The microelectronic devices may each include side surfaces of semiconductor material. The side surfaces may include a first portion having a highly irregular topography. The highly irregular topography may extend to a distance of between about 2 µm and about 6 µm from an adjacent major surface of the microelectronic device. The side surface may further include a second portion adjacent the first portion and having a less uneven surface.

Figure 12:
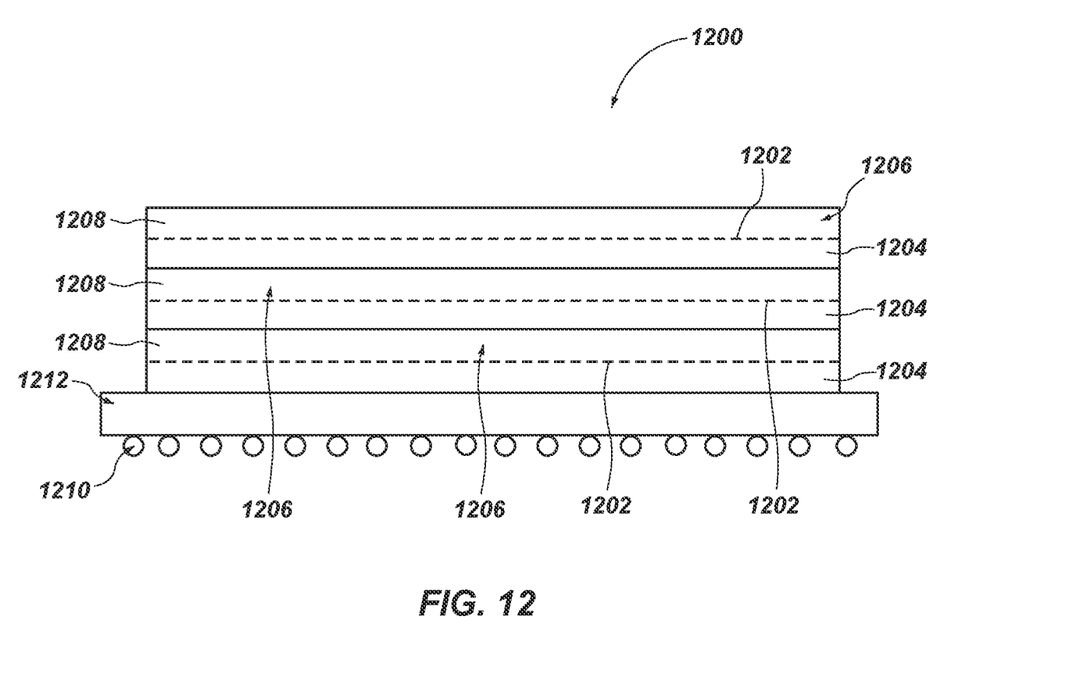
FIG. 12 illustrates a schematic side view of a microelectronic device package comprising a stack of microelectronic devices in accordance with an embodiment of the present disclosure.

FIG. 12 illustrates a microelectronic device 1200 formed from a stack of semiconductor dice 1202. The sides of the stack of semiconductor dice 1202 may be characterized by a pattern of alternating highly irregular surface topographies 1208 and uneven surfaces 1204. As shown, semiconductor dice 1202 were fabricated using implantation of a wafer 202 from a rear surface 302 thereof, resulting in highly irregular surface topographies 1208 on the upper portions of sides 1206 of semiconductor dice 1202.

The semiconductor dice 1202 may be stacked on a substrate 1212 configured to electrically couple the stack of dice 1202 to another component. The substrate 1212 may include discrete connection elements in the form of solder bumps 1210 configured to connect to higher level packaging. The substrate 1212 may be electrically coupled to the stack of die 1202, such as through TSVs (not shown) formed through each semiconductor die 1202. Similarly, each semiconductor die 1202 may be electrically coupled to the adjacent dice 1202 through the TSVs and conductive elements extending through the bond lines between adjacent semiconductor dice 1202 of the stack. For example, conductive (e.g., copper) pillars may connect to aligned terminal pads of adjacent semiconductor dice through solder reflow or diffusion bonding to operably couple the TSVs of adjacent dice 1202.

Embodiments of the present disclosure may enable the streets between die locations on a wafer to be reduced in width by requiring a much smaller area to complete the dicing operations to singulate a wafer into individual dice. Reducing the street width between the die locations on the wafer may enable a larger number of dice to be fabricated from a single wafer of semiconductor material.

Furthermore, embodiments of the present disclosure may substantially decrease the organic (e.g., polymer film residue, adhesive residue) and inorganic (e.g., semiconductor material) contaminant particles produced during the process of dicing or singulating individual semiconductor dice from a wafer. Residual contaminant particles on individual semiconductor dice may, as previously noted, cause damage and/or failures in associated microelectronic devices. Thus, reducing the volume of contaminant particles produced during the dicing or singulation process may similarly decrease the potential for damage or failures of the dice and associated microelectronic devices. Reducing the number of damaged or failed dice or microelectronic devices and decreasing the space required between the individual dice on each wafer may increase the yield and reliability of semiconductor dice and microelectronic devices incorporating such dice.

Increasing the yield of microelectronic devices by reducing the number of compromised semiconductor dice or assemblies and packages of same may increase the yield of such assemblies and packages, resulting in greater profitability from reduced costs for the production of the associated microelectronic devices. The microelectronic devices may be included in multiple different types of electronic devices, such as personal electronics (e.g., mobile devices, phones, tablets, etc.), computers (e.g., personal computers, laptops, etc.), etc. Reducing the cost of producing the microelectronic devices may in turn reduce the cost of producing the associated electronic devices.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A microelectronic device comprising:
a semiconductor material, including an active surface and a rear surface opposite the active surface;
side surfaces of the semiconductor material extending between the active surface and the rear surface and including:
a first portion having a highly irregular surface topography including residual ions, the highly irregular surface topography extending a distance of between 2 μm and 6 μm from one of the active surface and the rear surface of the microelectronic device; and
a second portion extending from the first portion to another of the active surface and the rear surface having less uneven surface.

2. The microelectronic device of claim 1, further comprising an active region comprising integrated circuitry over the active surface laterally inset from the side surfaces.

3. The microelectronic device of claim 2, further comprising a barrier region positioned peripherally between the active region and the side surfaces.

4. The microelectronic device of claim 3, wherein the barrier region is formed from a material selected to substantially prevent diffusion of materials other than the semiconductor material to the active region.

5. The microelectronic device of claim 3, wherein the barrier region is formed from a material selected from the group consisting of tungsten, titanium, cobalt, ruthenium, tantalum, tantalum nitride, indium oxide, tungsten nitride, and titanium nitride.

6. The microelectronic device of claim 2, further comprising residual implant ions adjacent the first portions of the side surfaces.

7. The microelectronic device of claim 6, wherein the residual implant ions comprise one or more of boron, phosphorus, arsenic, helium and hydrogen.

8. The microelectronic device of claim 7, wherein the residual implant ions comprise one of hydrogen or helium at a depth adjacent the first portion from either the active surface or the rear surface, and one of boron, phosphorus or arsenic at a lesser depth adjacent the first portion from a same surface as the hydrogen.

9. The microelectronic device of claim 1, wherein the highly irregular surface topography comprises point damage caused by an ion implantation process.

10. The microelectronic device of claim 1, wherein the less uneven surface comprises flat surfaces interrupted by fracture lines.

11. The microelectronic device of claim 1, wherein a distance between the active surface and the rear surface is less than 30 microns (μm).

12. A microelectronic package comprising:
one or more microelectronic devices, each comprising:
side surfaces of a semiconductor material and including:
a first portion having a highly irregular surface topography including one or more of point defects and dislocations, extending a distance of between 2 μm and 6 μm from an adjacent major surface of the microelectronic device; and
a second portion adjacent the first portion and having a less uneven surface.

13. The microelectronic package of claim 12, wherein the less uneven surface comprises flat surfaces interrupted by fracture lines.

14. The microelectronic package of claim 12, wherein the highly irregular surface topography is adjacent portions of the semiconductor material including implant ions of one or more of hydrogen, helium, boron, phosphorus and arsenic.

15. A method of manufacturing a microelectronic device, the method comprising:
forming microelectronic devices on an active surface of a wafer;
securing the wafer to a carrier wafer;
implanting ions to initiate dislocations in semiconductor material of the wafer along streets between the microelectronic devices, the dislocations extending to a distance of between 2 μm and 6 μm from one of the active surface and a rear surface of the wafer;

thinning the wafer to about 30 microns (µm) or less; and
heating the wafer to form cracks along the streets from stress concentrations proximate the dislocations.

16. The method of claim 15, wherein implanting ions comprises implanting ions through a mask having openings substantially aligned with the streets between the microelectronic devices.

17. The method of claim 16, wherein the mask comprises a same mask as used to fabricate features of the microelectronic devices.

18. The method of claim 16, wherein the mask comprises a reusable mask coupled to a face of an implant tool or within a chamber of an implant tool.

19. The method of claim 15, comprising implanting ions along the streets between the microelectronic devices from an active side of the wafer.

20. The method of claim 15, comprising implanting ions along the streets between the microelectronic devices from a rear side of the wafer.

21. The method of claim 15, wherein initiating dislocation in the wafer comprises initiating dislocations to a depth between 1 µm and 6 µm from an active surface or a rear surface of the wafer.

22. The method of claim 15, wherein heating the wafer comprises raising a temperature of the wafer by between 150° F. and 250° F. above ambient temperature.

23. The method of claim 15, wherein implanting ions includes implanting ions of one or more of hydrogen, helium, boron, phosphorus and arsenic.

24. The method of claim 23, further including implanting ions of hydrogen or helium to a greater depth from an active surface or a rear surface of the wafer than a depth of implanting ions or boron, phosphorus or arsenic from a same surface.

25. A method of separating microelectronic devices from a wafer, the method comprising:
employing an ion implantation process to provoke dislocations in a semiconductor wafer in streets between the microelectronic devices, the dislocations extending to a distance of between 2 µm and 6 µm from an adjacent major surface of the semiconductor wafer;
transferring the semiconductor wafer to a laterally expandable carrier material and adhering the semiconductor wafer to a surface of the carrier material; and
applying a tensile force on the wafer by expansion of the carrier material to form cracks in the streets between the microelectronic devices and separate the microelectronic devices.

26. The method of claim 25, wherein implanting ions is effected into a surface of the semiconductor wafer through a mask having openings substantially aligned with the streets between the microelectronic devices.

27. The method of claim 25, wherein the surface of the semiconductor wafer comprises one of an active surface or a rear surface opposite the active surface.

28. The method of claim 25, further comprising, before employing the ion implantation process:
thinning the semiconductor wafer from a rear surface thereof while supported on and secured to a rigid carrier structure from an initial thickness to a thickness of 30 µm or less; and, after employing the implantation process:
inverting the carrier structure to transfer and adhere the semiconductor wafer to the laterally expandable carrier material; and
releasing the carrier structure from the semiconductor wafer before expanding the carrier material.

* * * * *

UNITED STATES PATENT AND TRADEMARK OFFICE
CERTIFICATE OF CORRECTION

PATENT NO. : 11,784,050 B2
APPLICATION NO. : 17/241386
DATED : October 10, 2023
INVENTOR(S) : Andrew M. Bayless and Brandon P. Wirz It is certified that error appears in the above-identified patent and that said Letters Patent is hereby corrected as shown below:

In the Specification

| | | |
|---|---|---|
| Column 1, | Line 56, | change "wafer (C2 W)" to --wafer (C2W)-- |
| Column 4, | Line 38, | change "about 80 or even" to --about 80 µm, or even-- |
| Column 5, | Line 16, | change "about 50 such" to --about 50 µm, such-- |
| Column 5, | Line 16, | change "about 30" to --about 30 µm,-- |
| Column 5, | Line 17, | change "about 20 or less" to --about 20 µm, or less-- |
| Column 5, | Line 17, | change "about 10 Reducing" to --about 10 µm. Reducing-- |
| Column 5, | Line 22, | change "about 7 in 10 In the" to --about 7 to 10 µm. In the -- |

In the Claims

Claim 15, Column 15, Line 1, change "wafer to about 30" to --wafer to 30--

Signed and Sealed this
Ninth Day of January, 2024

Katherine Kelly Vidal
Director of the United States Patent and Trademark Office